United States Patent [19]

Gubbels et al.

[11] Patent Number: 5,121,355
[45] Date of Patent: Jun. 9, 1992

[54] INTEGRATED SEMICONDUCTOR MEMORY AND SIGNAL PROCESSOR

[75] Inventors: Wilhelmus C. H. Gubbels, Eindhoven, Netherlands; Jozef L. van Meerbergen, Zandhoven, Belgium

[73] Assignee: U.S. Philips Corp., New York, N.Y.

[21] Appl. No.: 563,737

[22] Filed: Aug. 3, 1990

Related U.S. Application Data

[63] Continuation of Ser. No. 430,920, Apr. 20, 1989, abandoned, which is a continuation of Ser. No. 73,794, filed as a PCT/NL86/00024, Aug. 11, 1986, abandoned.

[51] Int. Cl.$^5$ .............. G11C 7/00; G11C 8/00; G11C 11/413
[52] U.S. Cl. ............ 365/200; 365/154; 365/230.06; 365/51
[58] Field of Search .......... 365/51, 63, 230.01, 365/200, 230.06, 154; 357/45

[56] References Cited

U.S. PATENT DOCUMENTS

| | | | |
|---|---|---|---|
| 4,047,163 | 9/1977 | Choate et al. | 365/200 X |
| 4,660,178 | 4/1987 | Hardee et al. | 365/200 |
| 4,691,301 | 9/1987 | Anderson | 365/200 |
| 4,695,978 | 9/1987 | Itakura | 365/51 |
| 4,737,933 | 4/1988 | Chiang et al. | 365/230.01 X |
| 4,775,942 | 10/1988 | Ferreri et al. | 365/51 X |
| 4,849,938 | 7/1989 | Furutani et al. | 365/200 |

OTHER PUBLICATIONS

I.C.A.S.S.P., Apr. 8-11, 1986, Tokyo, Japan, J. L. van Meerbergen et al.
I.S.S.C.C., Feb. 1987, USA, J. L. van Meerbergen et al.

*Primary Examiner*—Alyssa H. Bowler
*Attorney, Agent, or Firm*—Steven R. Biren

[57] ABSTRACT

Increasing the storage capacity of high-performance signal processors while maintaining the original RAM cell necessitates modification of the entire lay-out of the circuit. The invention relates to the once-only design of peripheral circuitry which provides control of blocks of 4 full CMOS RAM cells (easy to process) or 9 double-layer polysilicon cells (more difficult to process, but having smaller dimensions). It is defined in the RAM peripheral circuitry whether all 9 cells can be accessed (memory capacity from $2^{xx}n$ to $(2^{xx}(n+1)+2^{xx}(n-2))$) or 8 cells can be accessed (memory capacity from $2^{x}n$ to $2^{xx}(n+1)$).

4 Claims, 3 Drawing Sheets

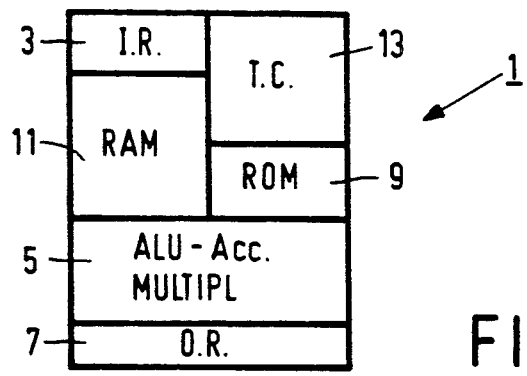
FIG.1
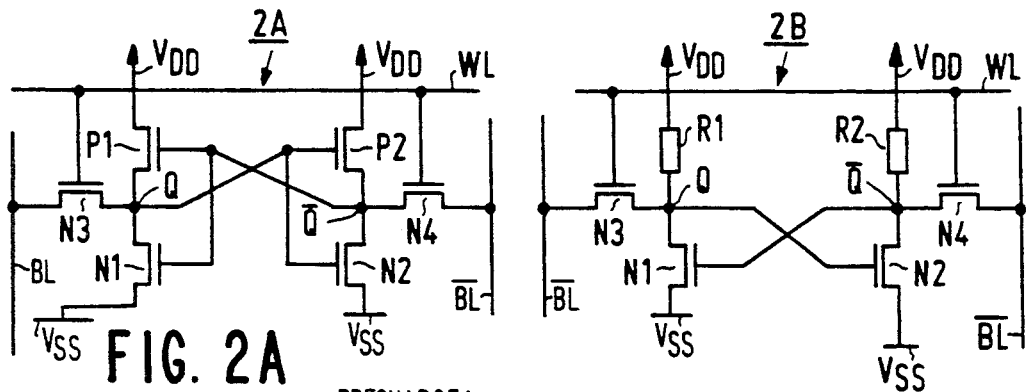
FIG. 2A
FIG. 2B
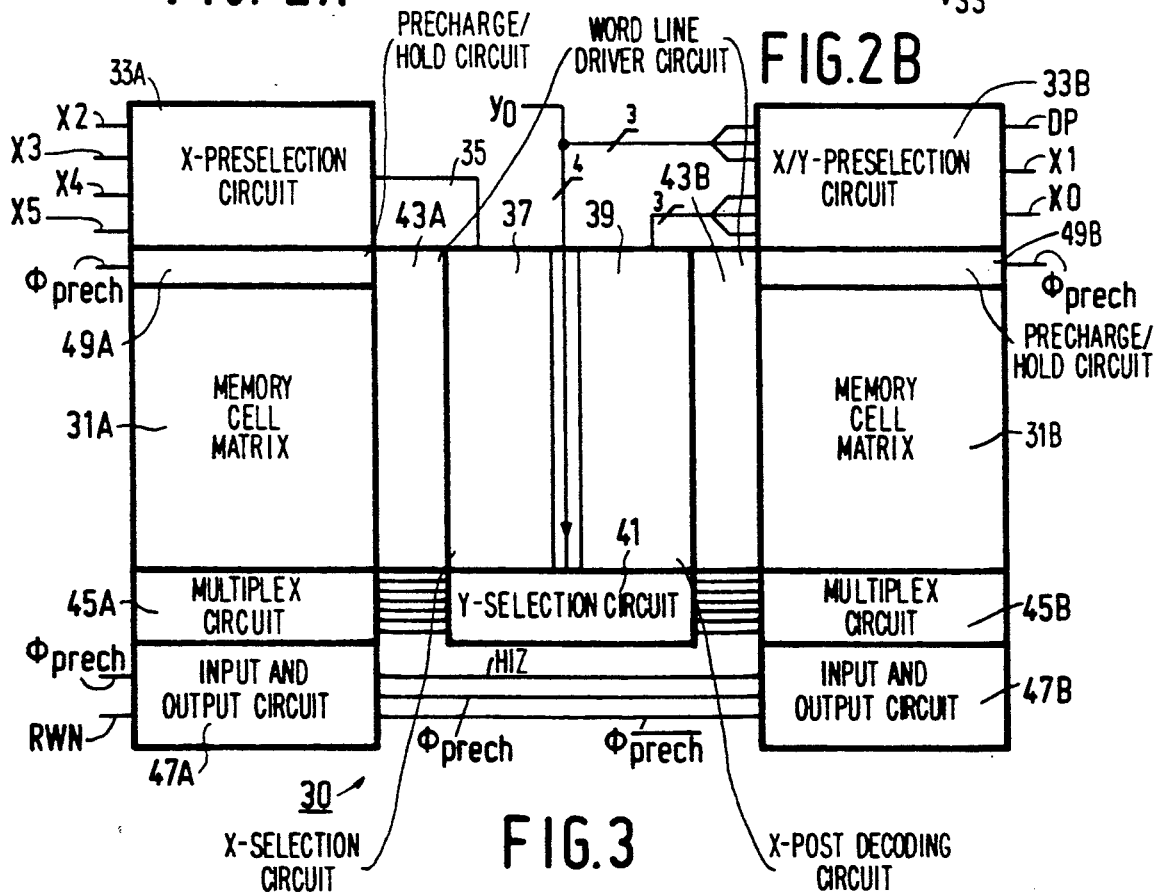
FIG.3

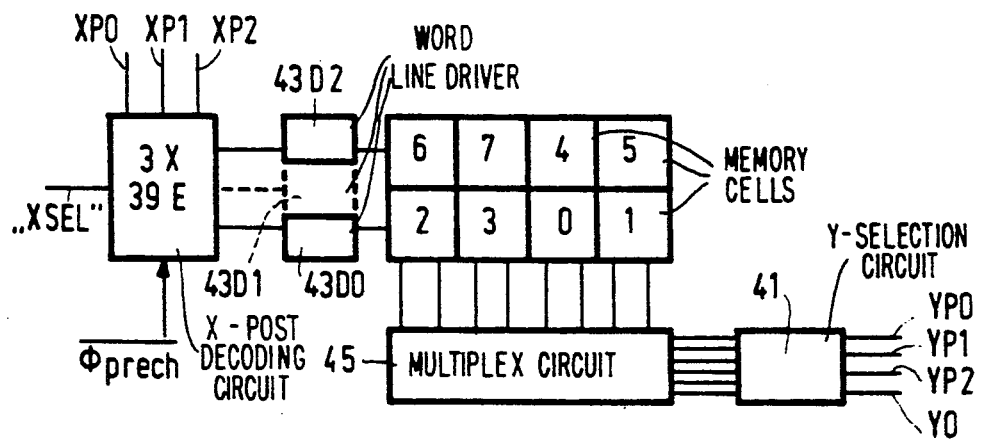
FIG. 6A
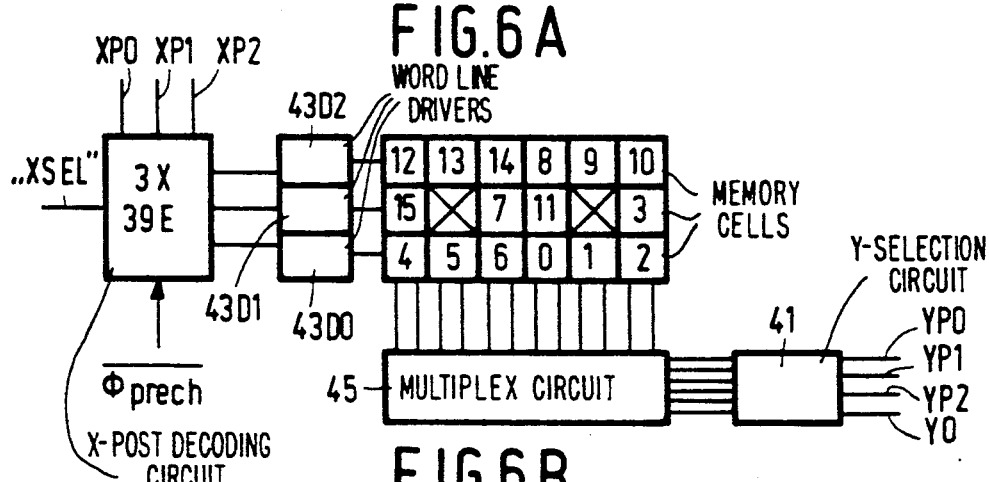
FIG. 6B
|   |    |    |     |     |     |     |     |     | 8 cells/block |        | 16 cells/block |        |
|---|----|----|-----|-----|-----|-----|-----|-----|---------------|--------|----------------|--------|
| DP| X0 | X1 | XP0 | XP1 | XP2 | YP0 | YP1 | YP2 | Y0=0 Cell sel no | Y0=1 Cell sel no | Y0=0 Cell sel no | Y0=1 Cell sel no |
| 0 | 0  | 0  | 1   | 0   | 0   | 1   | 0   | 0   | 0 | 2 | 0  | 4  |
| 0 | 0  | 1  | 1   | 0   | 0   | 0   | 0   | 1   | 1 | 3 | 2  | 6  |
| 0 | 1  | 0  | 0   | 0   | 1   | 1   | 0   | 0   | 4 | 6 | 8  | 12 |
| 0 | 1  | 1  | 0   | 0   | 1   | 0   | 0   | 1   | 5 | 7 | 10 | 14 |
| 1 | 0  | 0  | 1   | 0   | 0   | 0   | 1   | 0   | — | — | 1  | 5  |
| 1 | 0  | 1  | 0   | 1   | 0   | 0   | 0   | 1   | — | — | 3  | 7  |
| 1 | 1  | 0  | 0   | 0   | 1   | 0   | 1   | 0   | — | — | 9  | 13 |
| 1 | 1  | 1  | 0   | 1   | 0   | 1   | 0   | 0   | — | — | 11 | 15 |
FIG. 7

INTEGRATED SEMICONDUCTOR MEMORY AND SIGNAL PROCESSOR

This is a continuation of application Ser. No. 430,920, filed Apr. 20, 1989, which is a continuation of Ser. No. 073,794, filed June 15, 1987, both now abandoned.

BACKGROUND OF THE INVENTION

The invention relates to an integrated semiconductor memory, comprising memory cells which are arranged in a matrix and peripheral circuits for addressing memory cells at least in order to read data from the addressed memory cells. The invention also relates to an integrated signal processor having such a memory.

Within the family concept of an integrated product, preferably product versions having different storage capacities are made available. An increased storage capacity of an integrated memory implies an increased number of memory cells and an increased addressing capacity of the address decoding circuits in the periphery. In that case the surface area of the substrate increases substantially linearly; this usually has far-reaching consequences because it necessitates redesigning.

Expansion of the storage capacity has far-reaching consequences notably when the memory is integrated on a substrate together with a signal processor. Not only the memory, but also the parts of the processor which are arranged around the memory will be "shifted", so that a completely new lay-out must be made for the integrated processor and the associated memory. Redesigning an integrated product is expensive so that redesigning of a signal processor, necessitated by the expansion of the storage capacity of the memory integrated on the same substrate, is found to be very disadvantageous.

SUMMARY OF THE INVENTION

It is the object of the invention to provide an integrated semiconductor memory and an integrated signal processor having such a memory where, when the storage capacity is to be increased, the memory is integrated within the already existing limits for the lay-out of the memory.

A memory in accordance with the invention is chacharacterized in that the number of addressable memory cells deviates substantially from the number of memory cells to be potentially addressed by the peripheral circuits

BRIEF DESCRIPTION OF THE DRAWING

The invention will, be described in detail hereinafter with reference to the drawing, in which:

FIG. 1 shows a lay-out of a signal processor,

FIGS. 2A and B show two different types of static memory cells;

FIG. 3 shows diagrammatically a set-up of a memory in accordance with the invention;

FIG. 7 shows a truth table for the addressing of the memory sections shown in the FIGS. 6A and 6B.

DESCRIPTION O THE PREFERRED EMBODIMENTS

Figure 4:
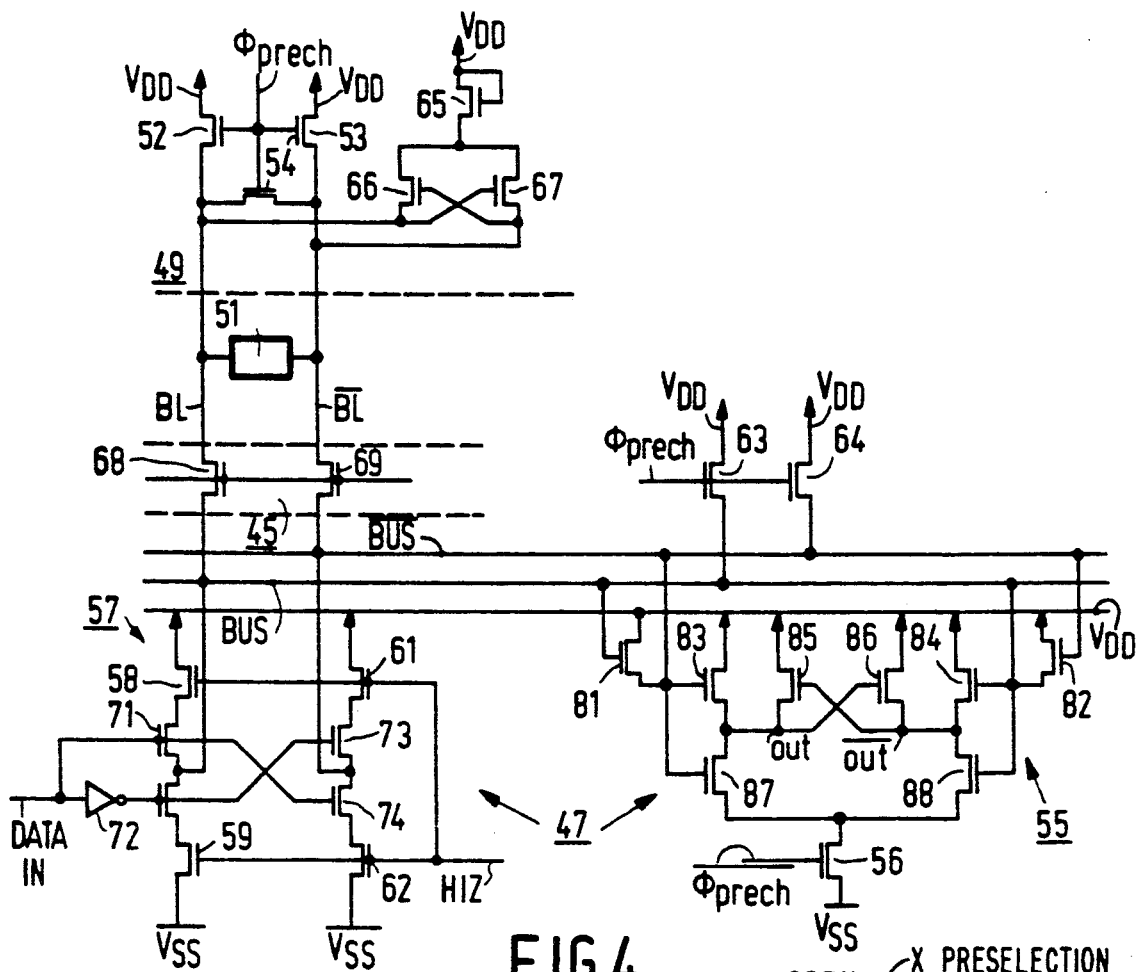
FIG. 4 shows a part of the circuit of the memory.

FIG. 1 shows a lay-out of a signal processor 1 which includes an input register 3, an arithmetic and logic unit 5 with accumulators and multipliers, an output register 7, a read-only memory 9, a read/write memory 11, and a timer unit 13. Should more storage capacity be required for a given application of the processor 1, so that the read/ write memory 11 would occupy a larger surface area, it would be necessary to reconsider or redesign the entire set-up of the processor 1.

By utilizing types of memory cells which differ as regards size and by making the decoder circuits suitable for the highest storage capacity (i.e. the memory matrix is then filled with the smallest (as regards surface area) memory cells), the processor can be constructed so as to have different storage capacities, without necessitating a modification of lay-out of the integrated processor. This will be illustrated hereinafter with reference to the figures.

FIG. 2A shows a known six-transistor memory cell 2A which includes a CMOS-transistor flipflop which is connected between the power supply terminals $V_{DD}$ and $V_{SS}$ and which comprises two PMOS transistors P1 and P2 and two NMOS transistors N1 and N2, which cell also includes two NMOS access transistors N3 and N4. The outputs Q and $\overline{Q}$ of the flipflop are connected to the bit line BL and to the integrated bit line $\overline{BL}$, respectively, when the access transistors N3 and N4 receive an appropriate control signal via the word line WL. The dimensions of a memory cell 2A of this kind are, for example $40.5 \times 40.75$ um$^2$.

FIG. 2B shows a known four-transistor memory cell 2B. The parts which correspond to those of the memory cell 2A are denoted by corresponding reference numerals. Instead of two large PMOS transistors (P1 and P2, FIG. 2A), the flipflop of the memory cell 2B utilizes polysilicon resistors R1 and R2, which require a more difficult technology but which result in a memory cell 2B whose surface area amounts to $25.5 \times 25.5$ um$^2$. The polysilicon resistors R1 and r2 could alternatively be omitted, thus simplifying the technology to be used for the manufacture of the cell and resulting in a quasi-static memory cell. The surface areas of the CMOS memory cell 2A and the memory cell 2B relate approximately as 2 : 1. However, both types of cell are substantially square and the ratio of the lengths (and the widths)of the cells 2A and 2B is 3 : 2. Instead of a group of $2 \times 2$ CMOS transistor memory cells, a group of $3 \times 3$ memory cells with polysilicon resistors R1 and R2 can be arranged on the same substrate surface area, so that the storage capacity is more than doubled. Doubling the storage capacity means that the addressing will require an address whose bit length has been increased by a single bit.

FIG. 3 diagrammatically shows a set-up of a memory 30 in accordance with the invention which includes two matrices 31A and 31B of memory cells which are arranged in rows and columns. Memory cells are addressed by means of the address signals DP, $Y_0$, $X_0$, $X_1$, $X_2$, $X_3$, $X_4$ and $X_5$. When use is made of CMOS transistor memory cells, the address signal DP can actually be dispensed with as will be explained hereinafter. The address signals $X_2$, $X_3$, $X_4$ and $X_5$ are applied to an X-preselection circuit 33A wherefrom 8 selection signals are derived which are applied, via a connection 35 having a width of 8 bits, to an X-selection circuit 37.

The address signals DP, X0 and X1 are applied to an X/Y preselection circuit 33B which generates three X-preselection signals and three Y-preselection signals which are applied to X-postdecoding circuit 39 and an Y-selection circuit 41, respectively, the latter circuit also receiving the address signal $Y_0$. Outputs of the X-selection circuit 37 are connected to further inputs of the X-postdecoding circuit 39, so that the word line drivers in both word line driver circuits 43A and 43B can be controlled by the combination of the three preselection signals, via an output of the X-postdecoding circuit 39. Each word line driver in the circuits 43A and 43B controls a word line of the memory cell matrices 31A and 31B, respectively. The Y-selection circuit 41 controls two multiplex circuits 45A and 45B whereby each time 8 columns of memory cells are simultaneously selected in each matrix 31A and 31B. The eight selected columns of memory cells in the matrices 31A and 31B are connected, via the multiplexer write circuits in the input and output circuits 47A and 47B which are controlled by the signals RWN and $\phi$prech which will be described hereinafter. The signal $\phi$prech is also applied to the precharge/hold circuits 49A and 49B whereby the bit line BL and the inverted bit line $\overline{BL}$ are charged for each read or write operation.

FIG. 4 shows a detail of FIG. 3: a precharge/ hold circuit 49 of, for example the circuit 49A, a memory cell 51 of the matrix 31A, a part 45 of the multiplex circuit 45A, and a read and write circuit 47 of the circuit 7A. The memory 30 operates in synchronism with a precharge/ sample clock pulse. When the signal $\phi$prech is "high", the bit line BL and the inverted bit line $\overline{BL}$ are charged to the same potential; the NMOS transistors 52, 53 and 54 are turned on. Furthermore, the read amplifier 55 is switched off, because the inverted signal $\phi$prech is applied to the gate of the transistor 56. The write circuit 7 is also inactive, because the signal HIZ, derived from the signals $\phi$prech and RWN, turns off the transistors 58, 59, 61 and 62. The bus lines BUS and $\overline{BUS}$ are charged to $V_{DD}$-VTN via the NMOS transistors 63 and 64 which are controlled by the signal $\phi$prech. The bus lines BUS and $\overline{BUS}$ connect outputs of the multiple circuits 45A and 45B to inputs of the output circuits 47A and 47B, respectively.

During the "high" state of the signal $\phi$prech, the address applied to the inputs DP, YO, X0 to X5 is also decoded as far as the X-postdecoding circuit 39. After termination of the signal $\phi$prech ($\phi$prech becomes "low"), the memory 30 enters the sample mode. Via the X postdecoding circuit 39, a word line is activated so as to connect the cells connected to the word line to the bit lines BL and $\overline{BL}$. The cross-coupled PMOS transistors 66 and 67, connected to the power supply source $V_{DD}$ via an NMOS transistor 65, ensure that the data from the memory cell 51 remains stable on the bit lines BL and $\overline{BL}$. The bit lines BL and $\overline{BL}$ are connected to the bus lines BUS and $\overline{BUS}$ via two transistors 68 and 69 of the multiplex circuit 45.

Via the bus lines BUS and $\overline{BUS}$, the data from the cell 51 reaches the gates of the PMOS transistors 81, 84 and the PMOS transistors 82, 83, respectively, as well as the gates of the NMOS transistors 88 and 87, respectively. The read amplifier 55 also includes two cross-coupled PMOS transistors 85 and 86, of which the junctions of the gates and main electro respectively are connected to one of the connections the transistors 83 and 87 and between the transit and 88, respectively and form the output OUT and the output $\overline{OUT}$ for the data.

new data is to be written into the memory cell 51, the signal HIZ is rendered "high", so that the data on the DATA IN is applied to the bus lines BUS and $\overline{BUS}$ via the four transistors 71, 72 and 73, 74 which form two push-pull amplifiers.

Figure 5:
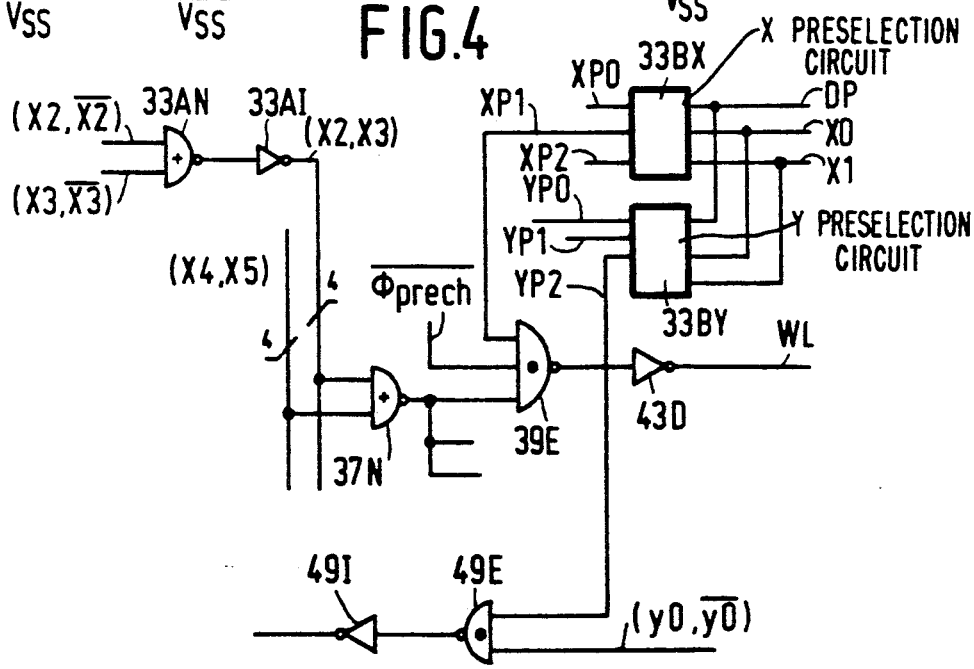
FIG. 5 shows a part of the address decoding circuit for the memory in accordance with the invention, FIGS. 6A and B show a memory section with a low cell density and high cell density, respectively.

FIG. 5 shows a detail of the preselection circuits 33A and 33B, of the X-selection circuit 37, of the X postdecoding circuit 39, and of the Y-selection circuit 41. The preselection circuit 33A includes eight 2-input NOR-gates 33AN and eight inverters 33AI. The four feasible combinations of the address signals $\overline{X2}$, X2, $\overline{X3}$ and are applied to four of the NOR-gates 33AN, the other four NOR-to four o gates 33AN receiving the four feasible combinations of the address signals X4, $\overline{X4}$, X5 and $\overline{X5}$, the eight NOR output signals being applied, via an inverter 33AI, to 2-input NOR gates 37N of the X-selection circuit 37. The outputs of the inverters 33AI are applied to the 16 NOR-gates 37N so that each logic combination of X2, $\overline{X2}$, X3 and $\overline{X3}$ is combined with each logic combination of X4, $\overline{X4}$, X5 and $\overline{X5}$.

Each output of the NOR-gates 37N is connected to an input of three NAND-gates 39E (only one has been shown) of the X-postdecoding circuit 39, each of said NAND-gates receiving the inverted signal $\phi$prech on a second input. The output of each NAND-gate 39E is connected to an input of a word line driver 43D. A third input of the three NAND-gates 39E received either X-preselection signal XPO or XP1 or XP2. The Figure shows only one NAND-gate 39E which receives the preselection signal XP1. The Y-selection circuit 41 includes six 2-input NAND-gates 49E, three of which receive the address signal 40 and one of the Y-preselection signals YP0, YP1, YP2. The other three NAND-gates receive the address signal $\overline{Y0}$ and one of the Y-preselection signals YPO, YP1, YP2.

The outputs of the NAND-gates 49E control, via inverters 491, the multiplex transistors (see FIG. 4, transistors 68 and 69) of the multiplex circuits 45A and 45B.

The described selection method aims to achieve the following: using the address signals X2, X3, X4 and X5, a bock of eight or eighteen memory cells is selected (see FIGS. 6A and 6B), the address signal DP, XO, X1 and Y0 determining which cell of the relevant block is addressed. When the memory 30 (FIG. 3) includes CMOS transistor memory cells, the block selected by means of the signals X2 to X5 will include eight cells and the address signal DP should always be "zero" in order to select a cell from the block by means of the remaining address signals X0, X1 and Y0 (see FIG. 6A). The cells in the block selected by means of the selection signal XSEL are numbered from 0 to 7. For the selection of cell 0, the signals XP0, YP0, and Y0 should be high (when the signal $\overline{Y0}$ is high, the cell 1 is selected). For the selection of the cell 5, the signals XP2, YP2 and Y0 should be high. This procedure is illustrated by the table of FIG. 7 in which the relationships between the address signals DP, X0, X1 and Y0, the preselection signals XP0, XP1, YP0, YP1 and YP2 and the cells to be selected thereby are stated in the upper four lines. Because of the absence of any activity of the signals XP1 and YP1, actually only two word line drivers 43D0 and 43D2 need be present. The word line driver 43D1 is denoted by a broken line, because it, will be integrated to the single lay-out to be made; however, it will not be connected. Furthermore, the multiplex circuit 45 needed receive only four control signals (4-to-1 multiplexer), so that the number of transistors controlled by the combinations (YP1, Y0) and (YP1, $\overline{Y0}$) can actually be omitted in the present embodiment.

FIG. 6B shows the situation in which the memory 30 is composed of a matrix comprising smaller memory cells with polysilicon resistors (R1, R2, see FIG. 2B). Using the signal "XSEL", a block of 18 memory cells is selected; 16 memory cells thereof can be selected by means of the address signals DP, X0, X1 and Y0 via the three NAND-gates 39E which control the word line drivers 43D0, 43D1 and 43D2. The preselection signals YP0, YP1 and YP2 control, in conjunction with the address signal Y0, the six-to-one multiplex circuit 45 via the Y-selection circuit 41. It is to be noted that the cells denoted by the reference X cannot be addressed. The cells which can be addressed are numbered from 0 to 15. From the last two columns and the "high" (=1) and the "low" (=0) values of the address signals DP, X0 to X5 and Y0 in the table of FIG. 7 it can be deduced in which situation the preselection signals XP0, XP1, XP2, YP0, YP1, YP2 may be active for the selection of given cells. It is also to be deduced from the table how the address signals DP, X0 and X1 must be logically combined in order to form the desired preselection signals.

It is to be noted that the address signals X0, X1 and also the signal DP are used for the word line selection (row selection) as well as the bit line selection (column selection) when the memory capacity is doubled.

The nonadressable cells which are denoted by the reference X in each block, of course, could be addressed if a further address bit is used in addition to the address signal DP. However, only ⅛ of the addressing capacity of this additional address bit will then be used.

What is claimed is

1. An integrated semiconductor memory, comprising a layout of memory cells which are arranged in a matrix, and peripheral circuits for addressing said memory cells at least in order to read data from the addressed memory cells, the peripheral circuits comprising means for individually addressing a number of address locations which is higher than the actual number of memory cells provided in the layout of said memory cells, and means for selecting the storage capacity of said matrix of memory cells in a given integrated semiconductor memory by providing a desired number of addressable memory cells int he layout which is substantially lower than a number of memory cell locations capable of being addressed by the peripheral circuits, wherein the memory cells are arranged in a number of rows and a number of columns, the peripheral circuits include row address decoding circuits and column address decoding circuits, the number of addressable memory cells is smaller than the product of the number of column address decoding circuits and the number of row address decoding circuits, the number of outputs of the column decoding circuits is larger than the number of column driver circuits of the matrix, and the memory cells comprise PMOS transistors and NMOS transistors, three column decoding outputs and three row decoding outputs being present for every two columns and rows, respectively.

2. An integrated semiconductor memory, comprising a layout of memory cells which are arranged in a matrix, and peripheral circuits for addressing said memory cells at least in order to read data from the addressed memory cells, the peripheral circuits comprising means for individually addressing a number of address locations which is higher than the actual number of memory cells provided in the layout of said memory cells, and means for selecting the storage capacity of said matrix of memory cells in a given integrated semiconductor memory by providing a desired number of addressable memory cells in the layout which is substantially lower tan a number of memory cell locations capable of being addressed by the peripheral circuits, wherein the memory cells are arranged in a number of rows and a number of columns, the peripheral circuits include row address decoding circuits and column address decoding circuits, the number of addressable memory cells is smaller than the product of the number of column address decoding circuits and the number of row address decoding circuits, the number of outputs o the row decoding circuits is larger than the number of rows of the matrix, and the memory cells comprise PMOS transistors and NMOS transistors, three column decoding outputs and three row decoding outputs being present for every two columns and rows, respectively.

3. An integrated semiconductor memory, comprising a layout of memory cells which are arranged in a matrix, and peripheral circuits for addressing said memory cells at least in order to read data from the addressed memory cells, the peripheral circuits comprising means for individually addressing a number of address locations which is higher than the actual number of memory cells provided in the layout of said memory cells, and means for selecting the storage capacity of said matrix of memory cells in a given integrated semiconductor memory by providing a desired number of addressable memory cells in the layout which is substantially lower than a number of memory cell locations capable of being addressed by the peripheral circuits, wherein the memory cells are subdivided into groups of nine cells which are arranged in three adjacent rows and three adjacent columns, only eight cells thereof being addressable.

4. An integrated memory circuit as claimed in claim 3, wherein the memory cell in the second row and the second column of each block is a nonaddressable cell.

* * * * *